United States Patent [19]

Schwab

[11] Patent Number: 4,470,651
[45] Date of Patent: Sep. 11, 1984

[54] MODULAR ELECTRICAL SHUNTS FOR INTEGRATED CIRCUIT APPLICATIONS

[75] Inventor: Pierre P. Schwab, Port St. Lucy, Fla.

[73] Assignee: B/K Patent Development, Inc., Los Angeles, Calif.

[21] Appl. No.: 374,725

[22] Filed: May 4, 1982

[51] Int. Cl.³ .......................................... H01R 31/08
[52] U.S. Cl. ...................................... 339/19; 339/260
[58] Field of Search .......... 339/18 C, 19, 222, 252 R, 339/258 T, 260, 261; 29/881, 884

[56] References Cited

U.S. PATENT DOCUMENTS

| | | | |
|---|---|---|---|
| 2,858,372 | 10/1958 | Kaufman | 339/19 |
| 3,932,013 | 1/1976 | Yeager et al. | 339/217 S X |
| 4,029,377 | 6/1977 | Guglielmi | 339/19 |
| 4,030,793 | 6/1977 | Hanlon et al. | 339/18 C X |
| 4,283,100 | 8/1981 | Griffin et al. | 339/19 |
| 4,356,361 | 10/1982 | Schwab | 200/16 D |

FOREIGN PATENT DOCUMENTS 1514988  6/1978  United Kingdom ................. 339/19

Primary Examiner—Eugene F. Desmond
Assistant Examiner—Steven C. Bishop
Attorney, Agent, or Firm—Pennie & Edmonds

[57] ABSTRACT

Modular electrical shunts for use in programming electric/electronic equipment are disclosed comprising a electrically insulating, substantially rectangular base having two end walls, an anchor pivot, a pair of parallel grooves adapted to slidably receive male terminals and a spring stop recess. An electrically insulating, substantially rectangular cover having a recess is bonded to the side of the base. A torsional spring contact is disposed between the base grooves adapted for torsional bias induced by the insertion of male terminal pins into the base grooves. In a second embodiment a bowed leaf spring contact, adapted for bias induced by the insertion of male terminal pins into the base, fits in the cover recess. Other embodiments relate to ganged shunts for selectively shorting combinations of male pins. The base and cover end walls may have horizontal grooves and bevelled edges on their external sides adapted for loading the shunt into a dispenser cartridge.

16 Claims, 17 Drawing Figures

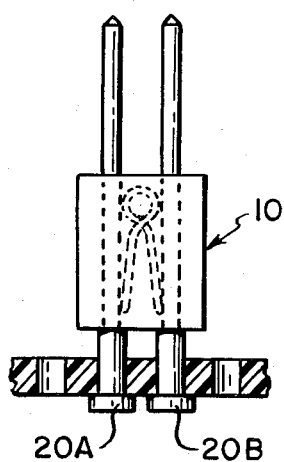
FIG. 1
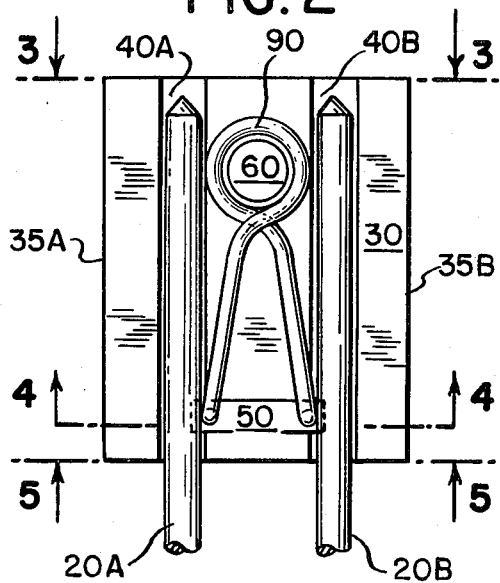
FIG. 2
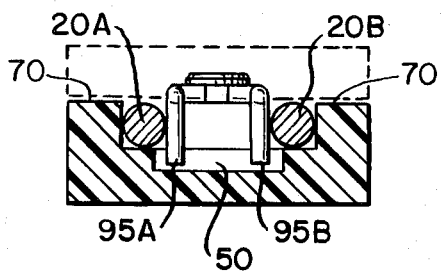
FIG. 4
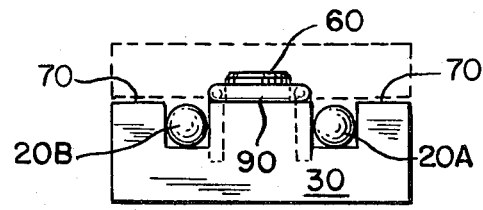
FIG. 3
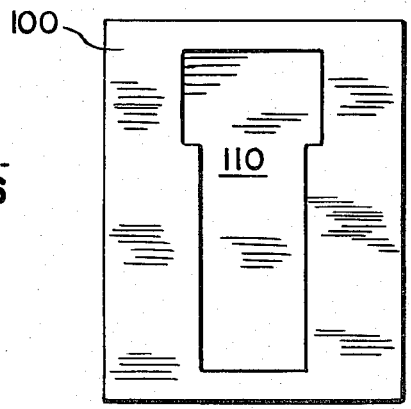
FIG. 5
FIG. 6

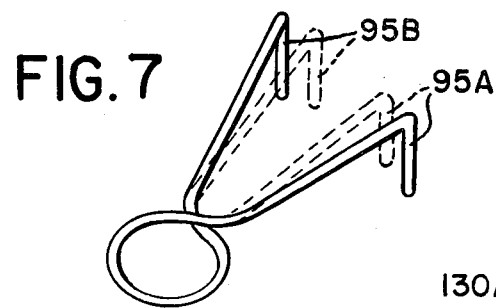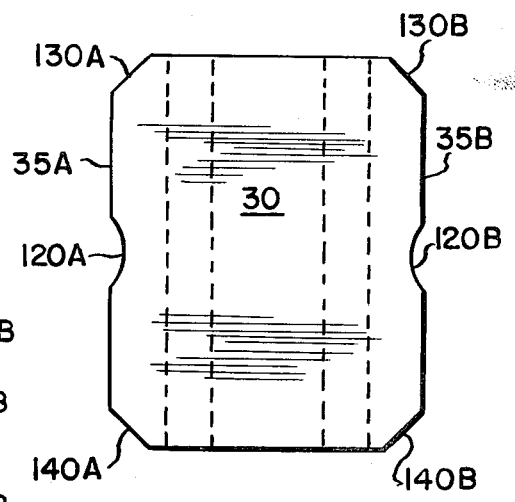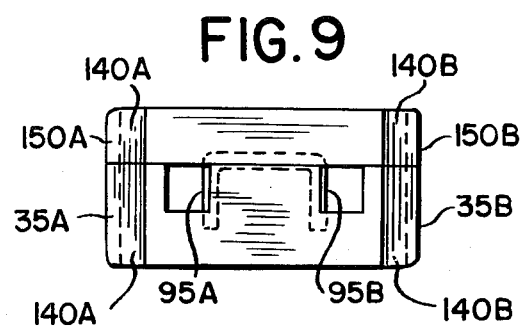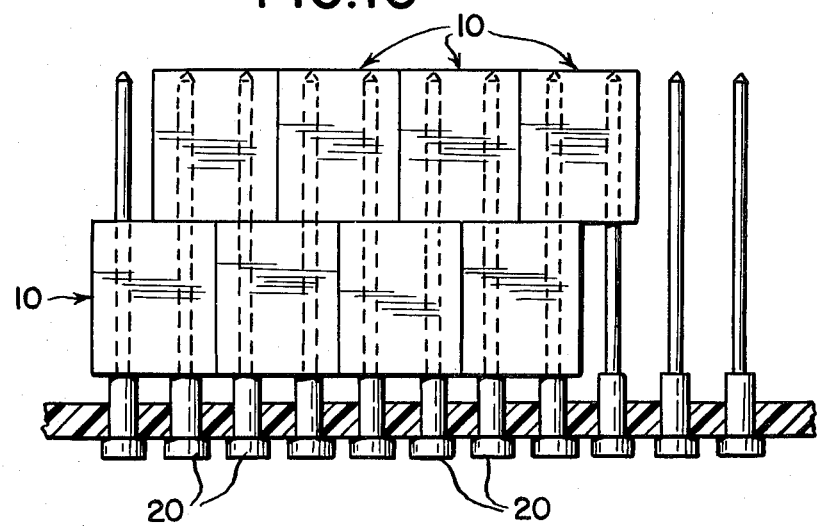

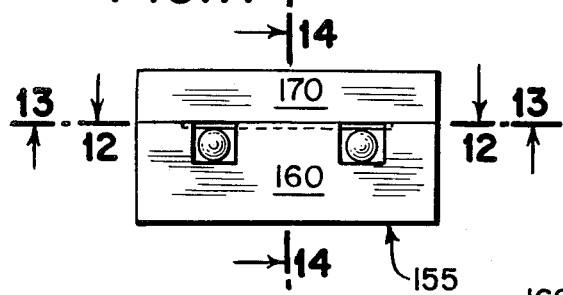
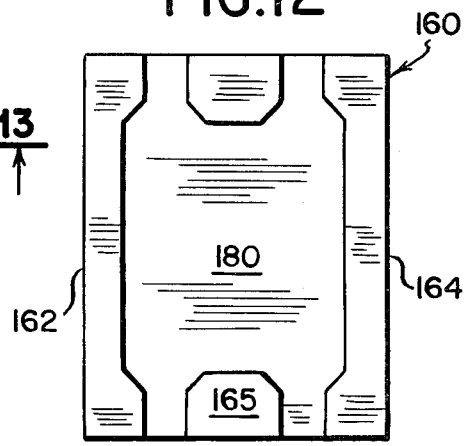
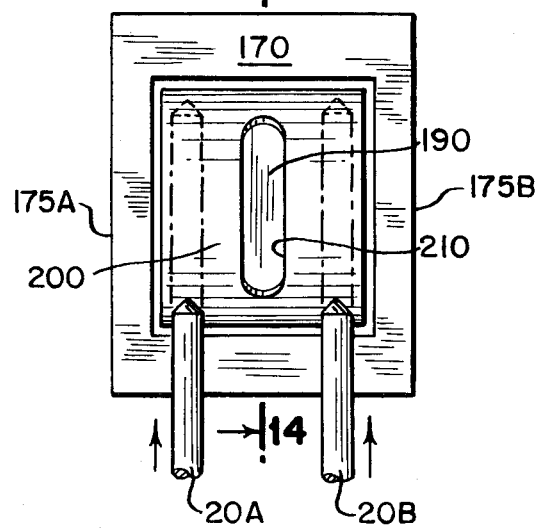
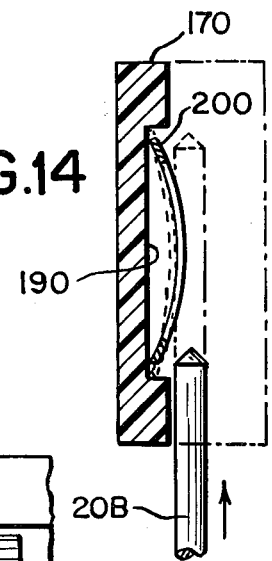
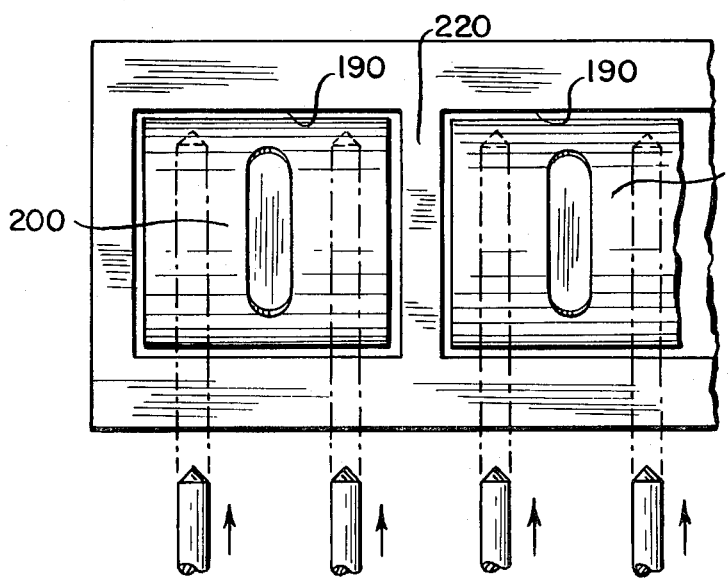

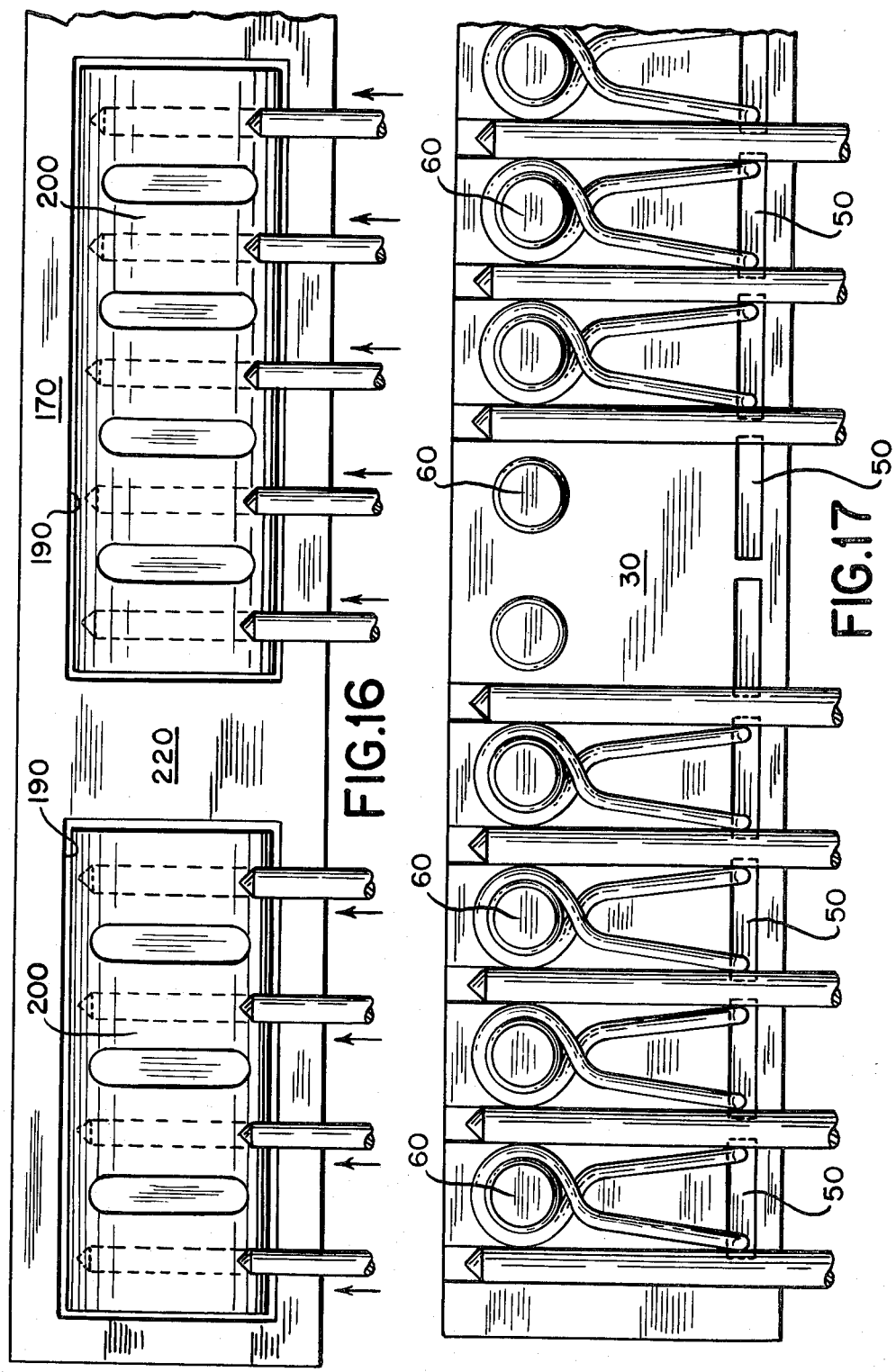

MODULAR ELECTRICAL SHUNTS FOR INTEGRATED CIRCUIT APPLICATIONS

BACKGROUND OF THE INVENTION

1. Field of the Invention

This invention relates to electrical shunts for electrical circuits.

More particularly, the invention has to do with novel electrical shunts of a modular design concept. The shunts of this invention are adapted for "closing" and-/or "opening" electrical circuits, e.g., on printed circuit boards or cards, in a programmable manner.

2. Description of the Prior Art

The electronics industry presently utilizes certain devices called DIP-shunts (DIP being an acronym for "dual in-line packaged") adapted to fit specific industrial standard socket terminal arrangements for components used in integrated circuit applications.

The sockets are arranged in industry-wide standard grid patterns which are dimensional multiples of 0.050" in each of the two dimensions, originally developed for integrated circuit applications. Typical socket grids are 0.100"×0.100" or 0.100"×0.200".

A DIP-shunt, also called a programming "jumper plug", is a type of device used in modern circuit design. These are described in U.S. Pat. No. 4,030,793 and are particularly useful for occasional reprogramming of operating such as vending machines, xerographic copiers, computer controlled machinery, and the like. However, conventional DIP-shunts suffer the disadvantage of having a metal jumper or shunt which is exposed to the environment, thereby increasing the risk of short circuiting during field service, unless the exposed electrically conducting part of the jumper is covered with a suitable insulating material.

A need has therefore existed for DIP-shunts of simpler mechanical design and greater durability in the field than those heretofore available.

Accordingly, it is an object of this invention to provide a structurally and mechanically reliable, readily packageable, and low cost DIP-shunt of a novel modular design concept for use in electrical circuits such as on printed circuit boards and in integrated circuits, in a programmable manner.

Another object is to provide shunts compatible with standard integrated circuit technology, said shunts beind modular in construction and adapted to being adjacently ganged whereby a plurality of shunts form a multi-station, dual-in-line packaged shunt configuration suitable for use on printed circuit boards or cards for programming or re-programming electronic/electromechanical equipment.

Another object is to provide shunts for use in 0.100"×0.100" or 0.100"×0.200" grid patterns.

These and other objects of the invention, as well as a fuller understanding of the utility and advantages thereof can be had by reference to the following disclosure and claims.

SUMMARY OF THE INVENTION

The foregoing objects are achieved according to the present invention whereby a modular, electrical DIP-shunt is provided for use in programming electric/electronic equipment.

The electrical shunt according to the present invention has an electrically insulating, substantially rectangular base having two end walls, an anchor pivot, a pair of parallel grooves adapted to slidably receive male terminal pins, and a spring stop recess. An electrically insulating, substantially rectangular cover having a recess and cover end walls is bonded to the side of the base. A torsional spring contact is disposed between the base grooves adapted to pivot about the base anchor pivot, the spring further adapted for torsional bias induced by the insertion of male terminal pins into the base grooves.

In a second embodiment of the invention the shunt has an electrically insulating, substantially rectangular base having two end walls and a base recess adapted to slidably receive male terminal pins. An electrically insulating, substantially rectangular cover having a recess and cover end walls is bonded to the side of the base. A bowed leaf spring contact in the cover recess is adapted for deflectional bias induced by the insertion of male terminal pins into the base recess.

The above embodiments may gang a selected sequence of terminals together in one base. In third embodiment, the ganged electrical shunt has an electrically insulating, substantially rectangular base having two end walls, a multitude of anchor pivots, a pair of parallel grooves corresponding to each anchor pivot adapted to slidably receive male terminal pins, and a spring stop recess corresponding to each anchor pivot. An electrically insulating, substantially rectangular cover having one or more recesses and cover end walls is bonded to the side of the base. One or more torsional spring contacts are disposed between the base grooves; each is adapted to pivot about its corresponding base anchor pivot. The springs are further adapted for torsional bias induced by the insertion of male terminal pins into the corresponding base grooves.

In a fourth embodiment, a ganged electrical shunt has an electrically insulating, substantially rectangular base having two end walls and one or more base recesses adapted to slidably receive male terminal pins. An electrically insulating, substantially rectangular cover having one or more cover recesses, each cover recess corresponding to a base recess, and cover end walls, is bonded to the side of the base. One or more bowed leaf spring contacts are in the cover recesses; each leaf spring corresponding to a cover recess. The spring is adapted for deflectional bias induced by the insertion of male terminal pins into the corresponding base recess.

In any of the above embodiments of the invention, the base end walls and the cover end walls preferably have a horizontal groove and bevelled edges on the external side adapted for loading the shunt into a dispenser cartridge.

BRIEF DESCRIPTION OF THE DRAWINGS

Further details of the present invention, including the nature, advantages, and various additional features thereof, and its preferred embodiments can be had by reference to the accompanying drawings, FIG. 1 is a side elevational view of the invention placed upon two male terminal pins;

FIG. 2 is a plan view of the base with the cover removed;

FIG. 3 is an end plan view of the invention, with its cover shown in phantom, taken along 3—3 in FIG. 2;

FIG. 4 is a sectional plan view of the invention taken along 4—4 of FIG. 2 with the cover shown in phantom;

FIG. 5 is a plan view of the other end of the invention taken along 5—5 of FIG. 2 with the cover shown in place;

FIG. 6 is an underside plan view of the cover;

FIG. 7 is a perspective view of the torsional spring contact;

FIG. 8 is an elevational view of an alternate embodiment of the invention;

FIG. 9 is a plan view of the cover of an alternate embodiment of the invention;

FIG. 10 is an elevational view of a multitude of shunts forming a series connection between a number of printed circuit board male terminal pins, also known as a "daisy chain";

FIG. 11 is a plan view of the invention placed upon two male terminal pins;

FIG. 12 is a sectional elevational view of the invention taken along 12—12 of FIG. 11;

FIG. 13 is a sectional elevational view of the invention taken along 13—13 of FIG. 11;

FIG. 14 is a sectional elevational view of the invention taken along 14—14 of FIG. 13 with the base of the shunt shown in phantom;

FIG. 15 is a sectional elevational view, similar to that of FIG. 13, of a ganged shunt which forms a connection between a selected series of printed circuit board male terminal pins;

FIG. 16 is a sectional elevational view, similar to that of FIG. 15, of a ganged shunt having a different combination of series terminal connections; and FIG. 17 is a sectional elevational view similar to that of FIG. 2, of another ganged shunt embodiment which forms a selected series of printed circuit board male terminal pin connections.

BEST MODE FOR CARRYING OUT THE INVENTION

In the following description the same structural elements shown in the accompanying drawings are designated by the same reference numerals. Letter suffixes are added to denote specific ones of those elements where necessary.

First Embodiment

Invention 10, as shown broadly in FIG. 1, is mounted on a pair of male terminal pins 20A and 20B. The DIP-shunt preferably comprises three parts, a base 30, a cover 100, and torsional spring contact 90, with base 30 and cover 100 forming the body of the DIP-shunt. The base 30 is of substantially rectangular shape and has two end walls 35A and 35B as shown in FIG. 2. In FIG. 2 a pair of male terminal pins 20A and 20B are partially inserted into the DIP-shunt base 30 by slidably inserting them into a pair of parallel base grooves 40A and 40B. As shown in FIGS. 3-5, the grooves 40A and 40B are square in profile and are sized for slidable insertion of the pins 20A and 20B with a slight amount of additional clearance for both ease of insertion and variations in either pin or casting tolerance.

The base 30 also has a spring stop recess 50 disposed between and intersecting the base grooves 40A and 40B at the bottom end of the base as shown in FIG. 4. An anchor pivot 60 is disposed at the upper end of the base 30. The pivot 60 is raised above the surface level 70 of the base 30, as shown in FIG. 3.

A cover 100 as shown in FIG. 5 is disposed on the open end surface 70 of the base 30 (although the cover may be eliminated by use of a one piece base) and is secured to the base 30 by means well known in the art, such as by the use of adhesives, heat bonding, or ultrasonic welding techniques. The cover 100 also contains a recess 110 as shown in FIG. 6. The base and cover are preferably made from a suitable rigid and electrically insulating plastic material.

A torsional spring contact 90 is disposed within the body of the dip-shunt, specifically the recess thereof. Torsional spring contact 90 comprises a coil portion and a pair of legs extending outward from the coil portion toward opposite sides of the recess of DIP-shunt 10. The spring pivots about the anchor pivot 60 as shown in FIGS. 2 and 3. Both the spring contact 90 and the anchor pivot 60 are primarily disposed within the cover recess 110. The spring contact 90 also has a pair of feet 95A and 95B, as shown in FIGS. 4 and 7, which are disposed within spring stop recess 50 of the base 30. In this manner the spring stop recess 50 restrains absolute torsional separation of the feet 95A and 95B and creates spring bias. Insertion of a pair of male terminal pins 20A and 20B, as shown in FIGS. 2 and 4, presses them against the feet 95A and 95B and induces additional torsional bias, which tends to compress the spring. Electrical contact between the two pins 20A and 20B is established by the spring.

The spring contact 90 can be advantageously nickel-gold plated to prevent oxidation, tarnishing or film formation on the contact surfaces which might otherwise diminish conductance at the very low electrical currents normally encountered in DIP-shunt applications.

FIG. 10 shows a method for using the invention in series to connect more than two pins. A multitude of DIP-shunts may be combined to form a series connection between a number of terminal pins, also known in the art as "daisy chaining".

Second Embodiment

In an alternate embodiment of the invention 155, as shown in FIGS. 11-15, leaf spring contact 200 is substituted for a torsional spring contact. Base 160 and cover 170 are accordingly adapted to receive leaf spring contact 200.

Base 160 has a base recess 180 adapted to receive male terminal pins upon mounting the shunt 155 on the pins 20A and 20B, as shown in FIG. 14. Base recess 180 also is adapted to receive contact spring 200 when the spring is in a relaxed state. Base 160 also has base end walls 162 and 164.

Cover 170, as shown in FIGS. 11, 13, and 14, is disposed on the open end surface 165 of base 160 and is secured to the base by means well known in the art, such as by the use of adhesives, heat bonding or ultrasonic welding techniques. The cover 170 also has end walls 175A and 175B and a recess 190 as shown in FIG. 14. The base and cover are preferably made from a suitable and electrically insulating plastic material.

The spring contact 200 is primarily disposed within cover recess 190, as shown in FIGS. 13 and 14. The leaf spring 200 is essentially rectangular in shape. More specifically, cover recess 190 includes a pair of opposed shoulders; and spring contact 200 comprise a first edge, which is located adjacent a first shoulder of the cover recess, a second edge, which is adjacent the second shoulder of the cover recess, and a body portion convexly extending outwrd into the recess of the base from both the first and second edges of the leaf spring. Spring 200 is adapted for bias by insertion of a male terminal pin, such as pin 20B in FIG. 14. Insertion of pin 20B presses against spring 200 in the radial direction of the pin, urging the spring to flatten out, which induces spring bias. Electrical contact between the two pins 20A and 20B as shown in FIG. 13 is established by the spring.

Spring 200 may define a hole, such as slot 210 to assure independent contact pressure against each pin, by allowing relatively unrestricted, independent deflection by the spring in each area which contacts a pin. Spring contact 200 can be constructed of metal or a metallized non-conducting material, such as plastic, and can be advantageously nickel-gold plated to prevent oxidation, tarnishing or film formation on the contact surfaces which might otherwise diminish conduction at very low electrical currents normally encountered in DIP-shunt applications.

Third Embodiment

FIGS. 15 and 16 show ganged versions of the invention having the construction features of the second embodiment, which provide for combinations of many pins in a single base. Multiple pin construction may short all of the pins together, or gangs of pins may be selectively shorted or insulated from each other by use of varied lengths of contact spring ribbon 200. By selecting different lengths of spring contacts 200, one or more pins may be shorted together. A break 220 between ribbon lengths 200 may act as an insulator which will isolate one group of pins from another group of pins. The breaks 220 create a multitude of cover recesses 190. Ribbons 200 are disposed in corresponding cover recesses 190. Thus, it is possible to "pre-program" a one piece ganged base to perform a desired sequence of shorts between terminals. Pre-programmed gangs of DIP-shunts are desirable for high speed manufacture and assembly of electrical components.

Fourth Embodiment

FIG. 17 shows a ganged shunt having construction features of the first embodiment, for selective shorting of different combinations of pins in one base.

It is preferred that anchor pivot 60, spring stops 50 and cover recesses 110 be molded between every two base grooves to minimize the number of moldings necessary for inventory. If desired, the cover may be molded with a single large cover recess to accommodate all contact springs.

In any of the above alternate embodiments of the invention, (e.g., FIGS. 8 and 9), the end walls 35A and 35B of the base 30 and the end walls 150A and 150B of the cover 100 have horizontal grooves 120A and 120B adapted for loading the shunt onto a dispenser cartridge, as disclosed in U.S. Pat. No. 4,356,361. The cover 100 and base end walls 35A and 35B also have beveled edges 130A and 130B and 140A and 140B for ease of insertion and removal from the above cartridge dispensing means.

As a practical matter, the outer dimensions of the DIP-shunt are defined more or less by electronics industry standards. For instance, DIP-shunt designs for 0.100" center-line spacing between male terminal pins would have a maximum outer length of 0.200" and a maximum width of 0.100" in order to achieve maximum packing density on printed circuit boards. Acceptable industry standards for DIP-shunt height could be either 0.100" or 0.250", depending upon the particular application of the shunt. Similarly, a DIP-shunt design for 0.200" male terminal center-line spacing would have a maximum outer length of 0.300" and a maximum width of 0.100".

Having thus described by invention, what I claim as new and desire to secure by Letters Patent is:

1. An electrical shunt comprising:
   (a) a substantially rectangular body having two end walls and a recess adapted to slidably receive a pair of spaced male terminal pins; and
   (b) a torsion spring contact secured within the recess of the body and including
      (i) a coil portion, and
      (ii) first and second legs extending outward from the coil portion to engage the male terminal pins and to maintain pressure engagement between the torsion spring and the male terminal pins.

2. An electrical shunt comprising:
   (a) a substantially rectangular body including a recess to slidably receive a pair of spaced male terminal pins and having first and second opposed shoulders; and
   (b) a bowed leaf spring contact disposed within the recess and including
      (i) a first edge located adjacent the first shoulder of the recess,
      (ii) a second edge located adjacent the second shoulder of the recess, and
      (iii) a convex body extending outward, toward the center of the recess, from both the first and second edges of the leaf spring to engage the male terminal pins and to maintain pressure engagement between the male terminal pins and the bowed leaf spring.

3. The electrical shunt according to any one of claims 1 or 2 wherein the body is constructed of an electrically insulating material.

4. An electrical shunt according to claims 1 or 2 wherein the body has a horizontal groove and bevelled edges on external sides adapted for loading the shunt onto a dispenser cartridge.

5. An electrical shunt comprising:
   an electrically insulating, substantially rectangular base having two end walls, an anchor pivot, a pair of parallel grooves adapted to slidably receive male terminal pins, and a spring stop recess;
   an electrically insulating, substantially rectangular cover having a recess and cover end walls, bonded to the side of the base; and
   a torsional spring contact disposed between the base grooves adapted to pivot about the base anchor pivot, the spring further adapted for torsional bias induced by the insertion of male terminal pins into the base grooves.

6. An electrical shunt comprising:
   (a) an electrically insulating, substantially rectangular base including
      (i) two end walls, and
      (ii) a base recess adapted to slidably receive a pair of spaced male terminal pins;
   (b) an electrically insulating, substantially rectangular cover bonded to a side of the base and including
      (i) cover end walls, and
      (ii) a recess having first and second opposed shoulders; and
   (c) a bowed leaf spring contact disposed within the recesses of the base and the cover and including
      (i) a first edge located adjacent the first shoulder of the cover recess, (ii) a second edge located adjacent the second shoulder of the cover recess, and (iii) a convex body extending outward into the base recess from both the first and second edges of the leaf spring to engage the male terminal pins and to maintain pressure engagement between the male terminal pins and the bowed leaf spring.

7. An electrical shunt comprising:
 (a) an electrically insulating, substantially rectangular base having two end walls and a base recess adapted to slidably receive male terminal pins;
 (b) an electrically insulating, substantially rectangular cover having a recess and cover end walls, said cover bonded to the side of the base; and
 (c) a bowed leaf spring contact in the cover recess adapted for deflectional bias induced by the insertion of male terminal pins into the base recess and defining a hole.

8. The electrical shunt according to any one of claims 5, 6 or 7 wherein:
 the base end walls and the cover end walls each have a horizontal groove and bevelled edges on the external sides adapted for loading the shunt onto a dispenser cartridge.

9. A ganged electrical shunt comprising:
 (a) a substantially rectangular body having two end walls and a multitude of substantially parallel recesses adapted to slidably receive a multiple of pairs of spaced male terminal pins; and
 (b) one or more tension spring contacts secured within the recesses of the body, each torsion spring including
  (i) a coil portion, and
  (ii) first and second legs extending outward from the coil portion to engage a pair of male terminal pins and to maintain pressure engagement between the torsion spring and said pair of male terminal pins.

10. A ganged electrical shunt comprising:
 (a) a substantially rectangular body including a multitude of substantially parallel recesses to slidably receive a multitude of spaced male terminal pins, each recess having first and second opposed shoulders; and
 (b) one or more bowed leaf spring contacts, each bowed leaf spring contact disposed within a selected recess and including
  (i) a first edge located adjacent the first shoulder of the selected recess,
  (ii) a second edge located adjacent the second shoulder of the selected recess, and
  (iii) a convex body extending outward, toward the center of the selected recess, from both the first and second edges of the leaf spring to engage a pair of male terminal pins and to maintain pressure engagement between said pair of male terminal pins and the bowed leaf spring.

11. The ganged electrical shunt according to any one of claims 9 or 10 wherein the body constructed of an electrically insulating material.

12. A ganged electrical shunt according to claims 9 or 10 wherein the body has a horizontal groove and bevelled edges on external sides adapted for loading the shunt onto a dispenser cartridge.

13. A ganged electrical shunt comprising:
 an electrically insulating, substantially rectangular base having two end walls, a multitude of anchor pivots, a pair of parallel grooves corresponding to each anchor pivot adapted to slidably receive male terminal pins, and a spring stop recess corresponding to each anchor pivot;
 an electrically insulating, substantially rectangular cover having one or more recesses bonded to the side of the base and cover end walls; and
 one or more torsional spring contacts disposed between the base grooves, each adapted to pivot about its corresponding base anchor pivot, the spring further adapted for torsional bias induced by the insertion of male terminal pins into the corresponding base grooves.

14. A ganged electrical shunt comprising:
 an electrically insulating, substantially rectangular base having two end walls and one or more base recesses adapted to slidably receive male terminal pins;
 an electrically insulating, substantially rectangular cover having one or more cover recesses, each cover recess corresponding to a base recess, and cover end walls, said cover bonded to the side of the base; and
 one or more bowed leaf spring contacts in the cover recesses, each leaf spring corresponding to a cover recess, adapted for deflectional bias induced by the insertion of male terminal pins into the corresponding base recess.

15. The ganged electrical shunt according to claim 14 wherein the contact defines a hole between the terminals.

16. A ganged electrical shunt according to any one of claims 13, 14, or 15 wherein the base end walls and the cover end walls each have a horizontal groove and bevelled edges on the external sides adapted for loading the shunt onto a dispenser cartridge.

* * * * *